United States Patent
Schmitt et al.

(10) Patent No.: US 11,417,922 B2
(45) Date of Patent: Aug. 16, 2022

(54) COOLING PLATE FOR THE TEMPERATURE CONTROL OF AT LEAST ONE BATTERY CELL AND A BATTERY SYSTEM

(71) Applicant: Robert Bosch GmbH, Stuttgart (DE)

(72) Inventors: Markus Schmitt, Tamm (DE); Andreas Ruehle, Bietigheim-Bissingen (DE); Benjamin Kopp, Remseck Am Neckar (DE)

(73) Assignee: Robert Bosch GmbH, Stuttgart (DE)

(*) Notice: Subject to any disclaimer, the term of this patent is extended or adjusted under 35 U.S.C. 154(b) by 379 days.

(21) Appl. No.: 16/587,243

(22) Filed: Sep. 30, 2019

(65) Prior Publication Data
US 2020/0106145 A1   Apr. 2, 2020

(30) Foreign Application Priority Data
Sep. 28, 2018   (DE) ........................ 102018216720.6

(51) Int. Cl.
*H01M 10/6554* (2014.01)
*H01M 10/6556* (2014.01)
*H05K 7/20* (2006.01)

(52) U.S. Cl.
CPC ... *H01M 10/6554* (2015.04); *H01M 10/6556* (2015.04); *H05K 7/20254* (2013.01)

(58) Field of Classification Search
CPC ............... H01M 10/6554; H01M 10/65–6556
See application file for complete search history.

(56) References Cited

U.S. PATENT DOCUMENTS

2012/0040226 A1*   2/2012   Kim ..................... H01M 50/30
                                                                 429/120
2014/0138063 A1    5/2014   Kawaura et al.

FOREIGN PATENT DOCUMENTS

| CN | 104848636 | | 8/2015 | |
| CN | 104848636 A | * | 8/2015 | ............. F25D 17/06 |
| DE | 19718064 | | 11/1998 | |
| DE | 112015002995 | | 3/2017 | |

* cited by examiner

*Primary Examiner* — Karie O'Neill Apicella
(74) *Attorney, Agent, or Firm* — Michael Best & Friedrich LLP

(57) ABSTRACT

A cooling plate (10) for temperature control of a battery cell, having a frame (12) with a coolant flow space (16) and at least one perturbing contour (30) inside the flow space (16), which is provided to increase turbulence in the coolant and is designed to support the at least one battery cell or for mechanical contacting with a cover (14) of the flow space (16). The perturbing contour (30) is arranged such that the coolant can flow around the perturbing contour (30) and the perturbing contour (30) is formed in the manner of at least one opening (50) in such a way that the coolant can flow through the at least one perturbing contour (30) and/or the frame (12) forms an opening (52) beneath the perturbing contour (30) in such a way that the coolant can flow beneath the at least one perturbing contour (30).

19 Claims, 4 Drawing Sheets

COOLING PLATE FOR THE TEMPERATURE CONTROL OF AT LEAST ONE BATTERY CELL AND A BATTERY SYSTEM

BACKGROUND OF THE INVENTION

The invention relates to a cooling plate for the temperature control of at least one battery cell. Furthermore, the invention also relates to a battery system with such a cooling plate.

Cooling elements are known from US2014/138063 for the temperature control of electronic devices, having perturbing contours in a flow space for a coolant. Such cooling plates have the drawback that a reliable temperature control of the traction battery cells is not always possible.

SUMMARY OF THE INVENTION

The present invention describes a cooling plate for the temperature control of at least one battery cell, especially for a traction battery. The cooling plate comprises a frame with a flow space designed for the throughflow of a coolant and at least one perturbing contour arranged inside the flow space. The perturbing contour is provided to increase the turbulence in the coolant flowing through the flow space and is designed to support the at least one battery cell or for mechanical contacting with a first cover of the flow space. According to the invention, the at least one perturbing contour is arranged in the flow space such that the coolant flowing through the flow space can flow around the perturbing contour and furthermore the at least one perturbing contour is formed in the manner of at least one opening in such a way that the coolant flowing through the flow space can flow through the at least one perturbing contour and/or the frame forms at least one further opening situated beneath the at least one perturbing contour in such a way that the coolant flowing through the flow space can flow beneath the at least one perturbing contour.

This has the advantage of providing an improved cooling performance or temperature control as compared to the prior art, so that a reliable temperature control of the at least one battery cell is possible. The increased turbulence which can be produced by means of the opening of the at least one perturbing contour and/or the further opening of the at least one perturbing contour serves for a more intense mixing of the coolant. In particular, a laminar flow formed by the coolant within the flow space, especially a laminar flow formed along a longitudinal direction of the cooling plate, is perturbed such that a temperature gradient perpendicular and/or parallel to the longitudinal direction is minimized. The opening and/or the further opening produces and/or produce for example a turbulent flow with eddy currents in the coolant. Preferably, the opening and/or the further opening produces and/or produce for example a flow with a Reynolds number over 100, preferably over 1000, especially preferably over 2000.

By a coolant is meant especially preferably a liquid coolant. Preferably, the coolant comprises a mixture of water and glycol. Of course, however, other embodiments are possible with coolants comprising gases and/or aerosols.

The frame preferably comprises a plate, especially a plate formed largely rectangular. Preferably, the frame and/or the plate is formed at least partly from plastic. A geometry of the plate or a geometry of the cooling plate will depend in particular on a geometry of the battery cell being cooled, especially a physical dimension of the battery cell being cooled, so that the battery cell can be thermally contacted by the cooling plate. Preferably, the cooling plate or the plate is flat or largely flat. A flat cooling plate is provided for the thermal contacting on a flat side surface of the battery cell. It is also conceivable for the cooling plate or the plate to have a curvature. This has the advantage that an especially good thermal contacting of the battery cell is possible. In addition, it has the advantage that an especially stable and reliable mechanical contacting or connection between the battery cell and the cooling plate is possible.

The frame comprises a flow space. By a flow space is meant in particular a spatial region formed for a coolant to flow through it, being in particular elongated in shape. In particular, it is understood that the flow space has a much larger extension in a longitudinal direction than in a direction arranged perpendicular to the longitudinal direction. In particular, a diameter of a flow cross section area of the flow space oriented perpendicular to the longitudinal direction is significantly smaller than a length of the flow space along the longitudinal direction. By a significantly greater first length than a second length is meant that the first length is larger by at least a factor of 2 than the second length, preferably by a factor of 4, especially preferably by a factor of 10. By a significantly smaller first length than a second length is meant that the first length is smaller by at least a factor of 2 than the second length, preferably by a factor of 4, especially preferably by a factor of 10. Preferably, the flow space has a base area which corresponds largely or substantially to a base area of the plate and/or a base area of the cooling plate.

In particular, a flow space is formed open for at least a portion along its longitudinal direction. Preferably, openings or open areas of the flow space are positioned such that they lie against the battery cell in the condition when mounted on the battery cell. In particular, it is conceivable that the openings or open areas of the flow space are arranged at least for a portion perpendicular or largely perpendicular to a normal to the cooling plate. By a first axis being arranged largely perpendicular to a second axis is meant that the first axis makes an angle with the second axis deviating not more than 8°, advantageously not more than 5°, especially advantageously not more than 2° from 90°.

By a longitudinal direction of the cooling plate or the flow space is meant in particular a principal direction of longitudinal extension of the cooling plate or the flow space, which preferably points in an intended flow direction of the coolant and/or in a mean intended flow direction of the coolant.

Preferably, the flow space each time comprises two webs arranged on the frame and/or preferably on the plate. Preferably, the webs run at least largely parallel to each other. Preferably, the two webs are in fluid-tight contact with the frame and/or with the plate. In particular, a coolant flowing through the flow space is bounded in fluid-tight fashion by the webs and the frame or the plate. A web is a boundary wall of the flow space. By a first axis being arranged largely parallel to a second axis is meant that the first axis makes an angle with the second axis deviating not more than 8°, advantageously not more than 5°, especially advantageously not more than 2° from 0°.

Preferably, the cooling plate is made as a single piece with the frame. By a single piece is meant in this context in particular materially bonded, such as by a welding process and/or a gluing process, etc., and especially advantageously one which is molded on, such as by being made from a casting and/or being made in a single or multiple component injection molding process. This has the advantage that the cooling plate has a high mechanical stability.

By a perturbing contour is meant in particular an element or component which changes a flow cross section area of the flow space for a portion, especially one which reduces it. The perturbing contour is designed especially to disrupt a laminar flow through the flow space, in particular to heighten the turbulence of the flow. Preferably, the perturbing contour is formed as a single piece with the frame and/or with the plate and/or with a web. For example, the perturbing contour may be formed as an extension of the frame and/or the plate and/or a web. By the coolant being able to flow around the perturbing contour is meant in particular that the perturbing contour is configured such that it can be flowed around by a circular flow flowing inside the flow space or by a flow moving along a closed curve, especially preferably a circular or largely circular curve, so that the perturbing contour is located inside the circular flow or the closed curve, especially in that the circular flow or the closed curve can encircle or encircles the perturbing contour completely at least once that the perturbing contour is configured such that a closed curve exists which encircles the perturbing contour completely at least once, or which has a number of turns with respect to the perturbing contour of at least one and which is situated entirely in the flow space.

By a further opening being arranged beneath the perturbing contour is meant in particular that the further opening is arranged on an underside of the perturbing contour, which is situated opposite a top side of the perturbing contour in the direction of the normal to the cooling plate, the top side of the perturbing contour being provided at least partially for a supporting of the at least one battery cell or for a mechanical contacting of a first cover of the flow space.

By a perturbing contour is meant furthermore an element or component which is designed for the supporting and/or mechanical contacting of the at least one battery cell and/or a first cover. In particular, the perturbing contour may be designed to fasten the at least one battery cell and/or the first cover, especially to fasten them in materially bonded manner.

If the opening and/or the further opening each comprise an inlet designed for an inflow of the coolant and an outlet designed for an outflow of the coolant, wherein the inlet and outlet are oriented oppositely in a longitudinal direction of the flow space, this has the advantage that the cooling performance or temperature control is further improved, since dead areas or dead zones on the cooling plate, which contribute little or nothing to the heat transfer, are avoided or minimized. In the case of the perturbing elements used in the prior art it is possible for a dead zone to form in the longitudinal direction of the flow space, downstream from a perturbing contour, which is scarcely flowed through by the coolant or in which the coolant flows relatively slowly. Such a dead zone in particular limits the heat transfer and in this way limits the cooling performance. If coolant flowing through the flow space flows through and/or flows underneath a perturbing contour, for example through an opening and/or a further opening, when the respective inlet and respective outlet are arranged oppositely in the longitudinal direction of the flow space, a region downstream from the perturbing contour will be flowed through by the coolant. A dead zone cannot form and a heat transfer in the region downstream from the perturbing contour is improved. In variants it is of course possible for the inlet and/or outlet to be arranged in any other manner, for example, the inlet and outlet may be arranged oppositely on a flow axis, wherein the flow axis is arranged largely parallel to the longitudinal direction or wherein the flow axis is oriented at an angle between 70° and 20°, preferably between 60° and 30°, especially preferably between 50° and 40° to the longitudinal direction. By selection of a position of the inlet and/or outlet, especially that of the flow axis, it is possible to adjust the degree of turbulence. In this way, it is possible to adapt the cooling plate to the technical requirements for the cooling plate, especially to the requirements for the temperature control performance, especially cooling performance, and/or to the requirements for a flow resistance of the cooling plate for the coolant.

If the inlet has an inlet cross section area and the outlet has an outlet cross section area, wherein the inlet cross section area is larger than the outlet cross section area, this has the advantage in particular that the coolant flowing through the flow space upon emerging from the perturbing contour has a higher velocity and a lower pressure than upon entering the perturbing contour. This has the result, for example, that a flow downstream from the perturbing contour is constricted. In this way, the turbulence in the coolant is further increased, in particular. The coolant can take up a larger quantum of heat per unit of time and area, so that a possible temperature control of the cooling plate is enhanced. By selection of a ratio between inlet cross section area and outlet cross section area, the degree of turbulence in the coolant can be adjusted, for example. Preferably, the inlet cross section area is twice as large as the outlet cross section area. In variants, the ratio of the inlet cross section area to the outlet cross section area will depend in particular on the technical requirements, especially the requirements for temperature control performance, in particular cooling performance, and/or to adapt to the requirements for flow resistance of the cooling plate for the coolant.

If the at least one perturbing contour has a round and/or oval and/or teardrop and/or parallelogram shaped cross section area and/or support surface of the perturbing contour, which are each situated parallel to the longitudinal direction of the flow space, this has the advantage that the turbulence of the coolant flowing through the flow space can be advantageously increased. In particular, by selection of the geometry or shape of the cross section area, the degree of turbulence can be adjusted. In this way, it is possible to adapt the cooling plate to the technical requirements for the cooling plate, especially to the requirements for temperature control performance, especially cooling performance, and/or to the requirements for a flow resistance of the cooling plate for the coolant.

A perturbing contour with a round and/or oval cross section area and/or support surface has in particular the further advantage that, in the case of a mechanical contacting of a flexibly configured first cover, especially a connection to the flexibly configured first cover, especially a materially bonded connection, no sharp corners will be present in a contacting area, which might result in stress peaks upon stretching of the flexibly configured cover. Stresses in the flexibly configured cover will then have a uniform, circular and/or elliptical geometry. The flexibly configured first cover is then especially durable and the cooling plate is especially reliable.

Because a plurality of first perturbing contours are arranged in a first row along a longitudinal direction of the cooling plate and a plurality of second perturbing contours are arranged in a second row along the longitudinal direction of the cooling plate, a more even increasing of the turbulence across the entire cooling plate becomes possible. Preferably, the plurality of first perturbing contours in the first row are arranged uniformly or equidistant. Preferably, the plurality of second perturbing contours in the second row are arranged uniformly or equidistant. It is conceivable in variants for a further row or more than one further row to be arranged along the longitudinal direction of the cooling plate, each with a plurality of perturbing contours. This further enhances the uniformity of the turbulence increase.

If the second perturbing contours of the second row are offset from the first perturbing contours of the first row, this has the advantage that the coolant flowing through the flow space is deflected additionally in a direction which connects the first row to the second row. In particular, the coolant flowing through the flow space is deflected additionally in a direction perpendicular to the longitudinal direction and parallel to a plane of the cooling plate. In particular, the coolant flowing through the flow space is deflected in a width direction of the cooling plate. For example, in this way it is possible for a flow of the coolant flowing through the flow space to run largely along a zig zag line or a wavy line. In this way, the turbulence is further increased in the coolant flowing through the flow space, so that the temperature control ability of the cooling plate can be further improved.

By a width direction of the cooling plate is meant in particular a principal direction of width extension of the cooling plate, which is arranged preferably perpendicular or largely perpendicular to the intended flow direction or a mean intended flow direction of the coolant. For example, the width direction is arranged perpendicular or largely perpendicular to the longitudinal direction. Preferably, the width direction is arranged perpendicular or largely perpendicular to the normal to the cooling plate.

Especially advantageous for increasing the turbulence is a cooling plate in which each time four perturbing contours of a plurality of perturbing contours form a parallelogram. By four perturbing contours forming a parallelogram is meant that the four perturbing contours are arranged at the corners of an imaginary parallelogram. Especially advantageous is a parallelogram having an internal angle less than 90°. It is conceivable in particular for a plurality of perturbing contours to be arranged on a parallelogram grid, especially on a rectangular grid.

A cooling plate with a first cover mechanically contacting the at least one perturbing contour, which first cover bounds the flow space in at least partly fluid-tight fashion and is provided for thermal contacting with the at least one battery cell, has the advantage that the coolant flowing through the flow space can be led especially securely through the cooling plate. Because the first cover mechanically contacts the at least one perturbing contour, a reliable increasing of the turbulence is assured. It is advantageous to use a sufficiently thin first cover, so that it has an especially low resistance to thermal conduction. In this way, an especially good temperature control of the battery cell is possible.

For example, the first cover is designed to bound the open area or the open areas of the flow space in at least partly fluid-tight fashion. For example, the first cover can contact the webs of the flow space in fluid-tight fashion, so that a coolant flowing through the flow space is bounded by the webs, the first cover and the frame or the plate in fluid-tight fashion.

A cooling plate with a second cover, which bounds the flow space in at least partly fluid-tight fashion at the further opening, has the advantage that the frame can be produced in an especially easy manner. For example, the further opening can be formed as a through opening in the frame or in the plate, for example by a punching process, which is then covered by the second cover. Advantageously, the second cover is arranged parallel or largely parallel to the first cover. Advantageously, the second cover is arranged on an underside of the frame. By an underside of the frame is meant a side of the frame which is situated perpendicular or largely perpendicular to the normal to the cooling plate and opposite a top side of the frame. By a top side of the frame is meant a side of the frame which is situated perpendicular or largely perpendicular to the normal to the cooling plate and which is the side which lies against the at least one battery cell or is arranged closest to it in the condition mounted on the at least one battery cell.

If the first cover is at least partially flexible in configuration, the first cover can be placed or flattened especially well against the at least one battery cell, especially to make thermal contact. This enables especially efficient cooling of the battery cell. In particular, a flexibly configured first cover can be outwardly stretched or inflated at least for a portion by an internal pressure generated inside the cooling plate by the coolant flowing through the flow space. Such areas of an outwardly stretched or inflated flexibly configured cover enable an equalizing of unevenness at a surface of the battery cell designed for thermal contacting. This enables an improved thermal contacting of the at least one battery cell.

By a flexibly configured first cover is meant in particular a cover which is elastically or at least partly elastically deformable. In particular, a flexibly configured first cover is deformable by a force acting upon it and designed to return at least partly to its original shape when the force goes away.

The cooling plate is further improved when the flexibly configured cover comprises at least one film, preferably comprises a plurality of films, especially one formed as a composite film. In this way, a good heat transfer between the coolant and the battery cell is assured for an especially durable seal of the flow space.

If the flexibly configured cover is materially bonded to the frame, especially to the webs bordering on the flow space, this has the advantage that the fluid-tight sealing of the flow space by the flexibly configured cover is especially secure and reliable. By a materially bonded connection is meant in particular a connection by a sealing process, especially a hot sealing process. Preferably, a materially bonded connection may be a glue connection, a connection by vulcanization, a welded connection—especially a laser welded connection—and/or a soldered connection.

If the flexibly configured cover is materially bonded to the at least one perturbing contour, this has the advantage that the fluid-tight sealing of the flow space by the flexibly configured cover is further improved in terms of safety and reliability.

If the frame comprises a first port, which is provided for a supply of the coolant, and the frame comprises a second port, which is provided for a drainage of the coolant, this has the advantage that the cooling plate is especially reliable and robust, in particular leakproof or tight.

Preferably, the cooling plate is formed as a single piece with the first port and/or the second port. This has the advantage that the cooling plate has a high mechanical stability. Preferably, the frame comprises the first port and/or the second port. Preferably, the frame is formed as a single piece with the flow space and/or the first port and/or the second port. Preferably, at least one web of the flow space is formed as a single piece with the frame and/or with the plate of the frame.

A battery system comprising a cooling plate according to the present invention and a battery module, wherein the battery module comprises at least one battery cell and the at least one battery cell is arranged on the flow space, so that a thermal contacting of the at least one battery cell and the flow space is formed, has the advantage that the battery module has an especially good anticipated service life on account of the fact that the cooling plate can always provide the necessary cooling power.

It is conceivable in particular for the battery module or the at least one battery cell to have a contact surface which is provided for thermal contacting with the cooling plate and which bounds the cooling plate, especially the flow space, in at least partly fluid-tight fashion.

Preferably, the at least one battery cell is arranged on the flow space or on the cooling plate such that a mechanical contacting of the at least one battery cell and the at least one perturbing contour is formed.

A battery system comprising a cooling plate according to the present invention and a battery module, wherein the battery module comprises at least one battery cell and the at least one battery cell is arranged on the first cover so that a thermal contacting of the at least one battery cell and the first cover is formed, is especially user-friendly. In particular, a changing of the battery module and/or the at least one battery cell is especially easy, since for example the cooling circuit does not need to be opened during the change.

BRIEF DESCRIPTION OF THE DRAWINGS

The drawings show exemplary embodiments of the cooling plate according to the present invention, which are explained more closely in the following description. In the drawings.

DETAILED DESCRIPTION

In the various variant embodiments, the same parts are given the same reference numbers.

Figure 1:
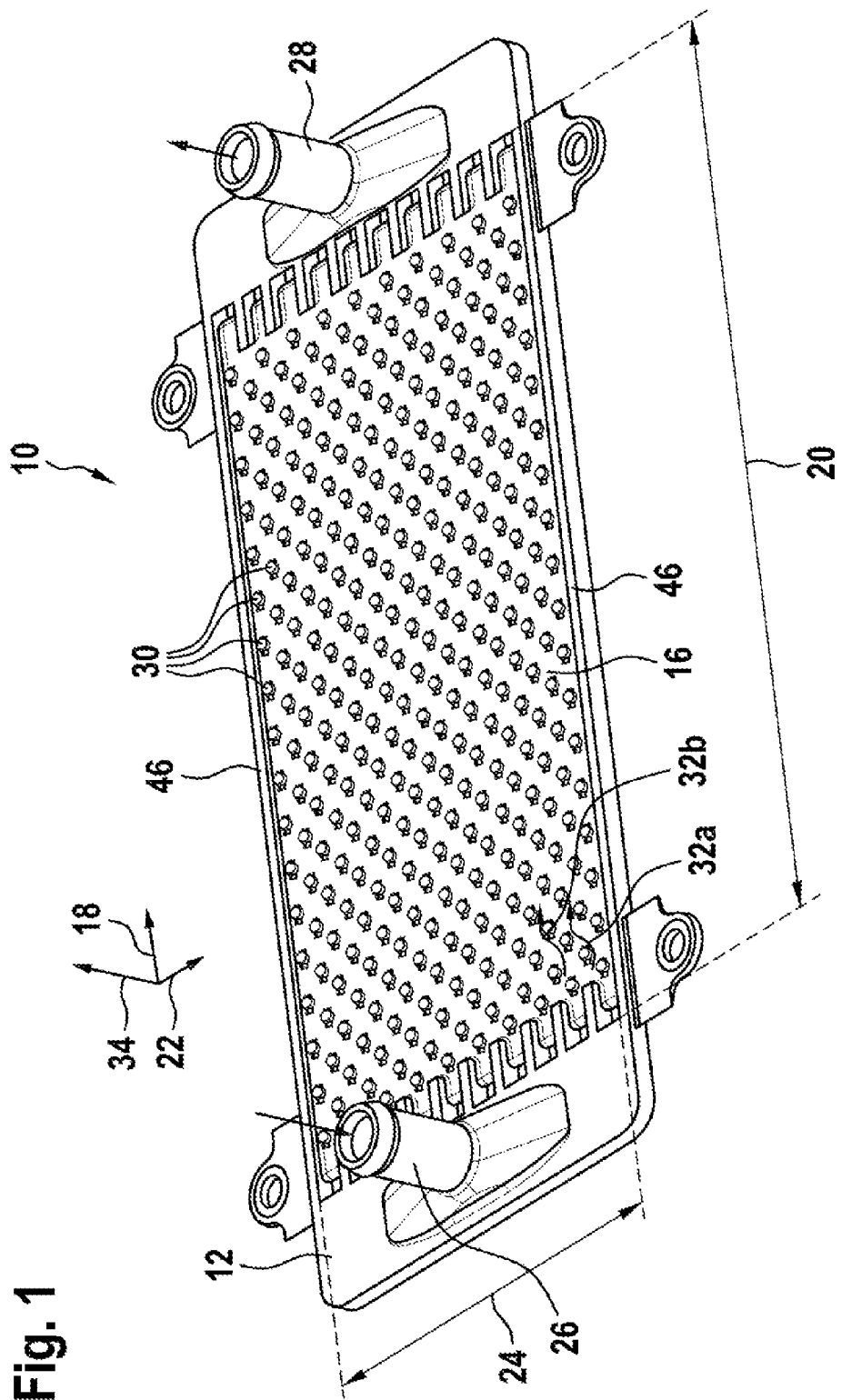
FIG. 1 shows a first embodiment of a cooling plate according to the present invention.

FIG. 1 shows in a perspective view one embodiment of a cooling plate 10 according to the invention for the temperature control of at least one battery cell.

The cooling plate 10 comprises a frame 12. The frame in the exemplary embodiment shown in FIG. 1 is made of plastic. The frame 12 comprises a flow space 16. The flow space 16 has a flow space length 20 in a longitudinal direction 18 of 40 cm for example. In alternative embodiments, the value of the flow space length 20 depends on the technical requirements, especially a dimensioning of the battery cell, such as the physical dimensions. The flow space length 20 in particular may be between 10 cm and 80 cm, preferably between 20 cm and 60 cm, especially preferably between 30 cm and 50 cm.

The flow space 16 in the exemplary embodiment shown in FIG. 1 has a flow space width 24 in a width direction 22 of 10 cm for example. In alternative embodiments, the value of the flow space width 24 depends on the technical requirements, especially a dimensioning of the battery cell, such as the physical dimensions. The flow space width 24 in particular may be between 2 cm and 20 cm, preferably between 5 cm and 15 cm, especially preferably between 7 cm and 12 cm.

The flow space 16 comprises for example a plurality of perturbing contours 30. The perturbing contours 30 are arranged inside the flow space 16. For example, the perturbing contours 30 are arranged so that a coolant flowing through the flow space 16 can flow around them. For example, a coolant flowing through the flow space 16 can be disrupted by means of the perturbing contours 30 so that for example the turbulence of the coolant can be increased.

The frame 12 has for example a first port 26, which is designed to supply a coolant. The frame 12 has for example a second port 28, which is designed for drainage or outflow of the coolant. FIG. 1 illustrates an intended flow profile of the coolant during an operation of the cooling plate 10. The coolant flows through the first port 26 into the cooling plate 10. Next, the coolant flows through the flow space 16. Within the flow space 16, the coolant flows on average along the longitudinal direction 18, for example. In preferred embodiments, a mean flow direction 26 is arranged parallel or largely parallel to the longitudinal direction 18. The mean flow direction denotes in particular a flow direction of the coolant averaged over time and/or over a flow cross section area of the flow space. In the exemplary embodiment shown in FIG. 1, the coolant flows around the perturbing contours 30. A respective flow pathway 32a and 32b along which two fluid elements of the coolant liquid respectively flow is illustrated in FIG. 1. The flow pathways 32 each run along a wavy line around the perturbing contours 30. The coolant then flows through the second port 28 and out from the cooling plate 10.

Figure 2:
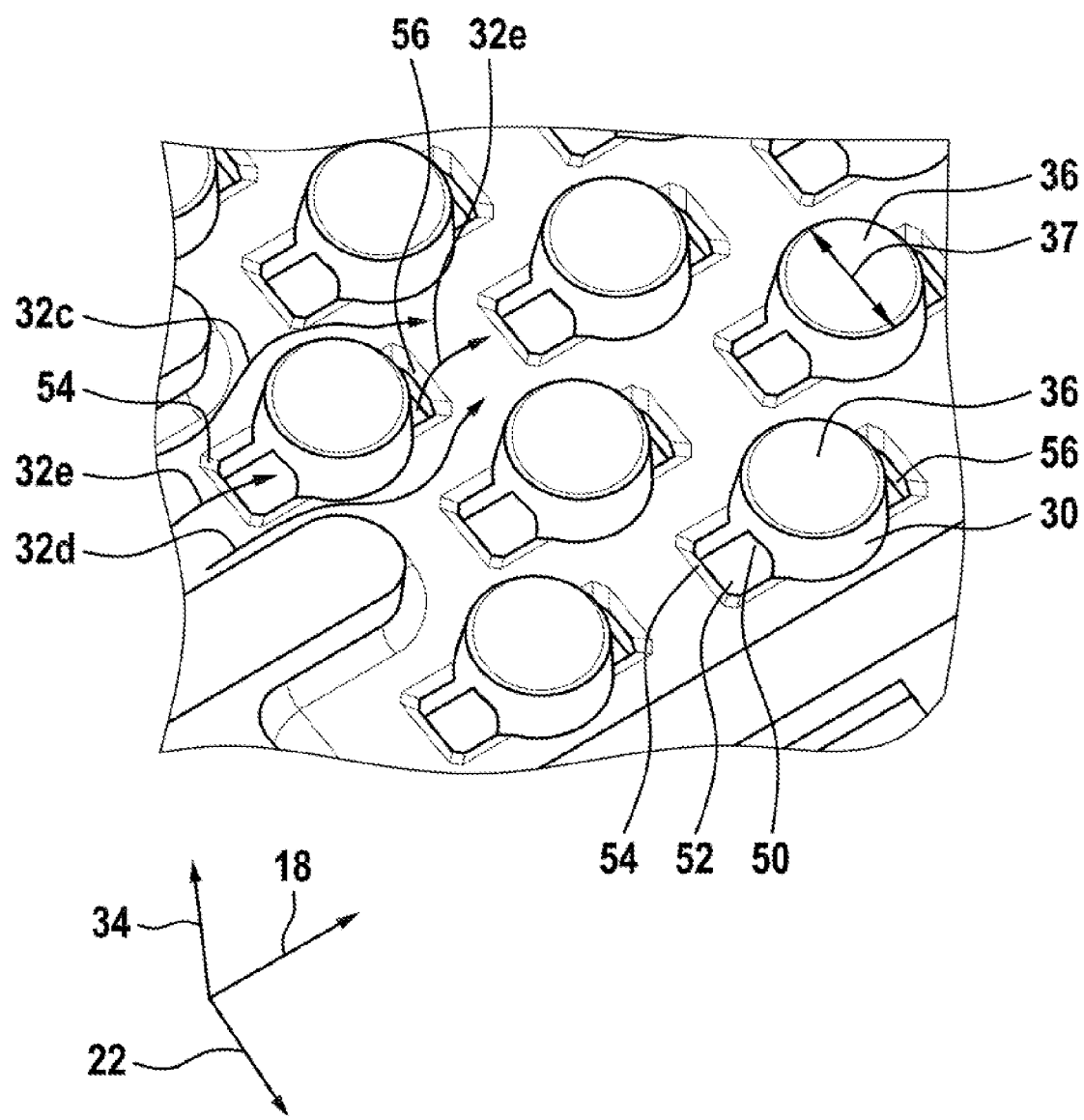
FIG. 2 shows the first embodiment of the cooling plate according to the present invention in a detail view.

FIG. 2 shows a detail view of one embodiment of the cooling plate 10 per FIG. 1. The perturbing contours 30 each have an opening 50, for example. The opening 50 is formed in such a way that the coolant flowing through the flow space 16 can flow through the respective perturbing contour 30. For example, the frame 12 has a further opening 52 respectively for each perturbing contour 30. The further opening 52 is arranged respectively beneath a perturbing contour 30. The further opening 52 is formed in such a way that the coolant flowing through the flow space 16 can flow underneath the respective perturbing contour 30.

In the exemplary embodiment shown in FIG. 2, the opening 50 and the further opening 52 comprise an inlet 54, designed for an inflow of the coolant. In alternative variants, it is conceivable for the opening 50 to comprise the inlet 54. In further variants, it is conceivable for the further opening 52 to have the inlet 54. It is possible for the opening 50 and the further opening 52 to each comprise an inlet 54, especially inlets 54 which are spatially or fluidically separated from each other.

In the exemplary embodiment shown in FIG. 2, the opening 50 and the further opening 52 are for example fluidically connected to each other, especially along the longitudinal direction 18, so that a fluid flow or a fluid element can flow at the same time through the opening 50 and the further opening 52. In the exemplary embodiment shown in FIG. 2, the opening 50 is arranged on an underside of the perturbing contour 30. The opening 50 lies directly at the further opening 52 of the frame 12. The opening 50 forms together with the further opening 52 a resulting opening or a flow duct through the perturbing contour 30. In variants, it is conceivable for the opening 50 and the further opening 52 to be spatially separated from each other, especially to not be connected fluidically to each other.

In the exemplary embodiment shown in FIG. 2, the opening 50 and the further opening 52 comprise an outlet 56, which is designed for an outflow of the coolant. In further variants, it is conceivable for the opening 50 to comprise the outlet 56. In alternative variants, it is conceivable for the further opening 52 to comprise the outlet 56. It is possible for the opening 50 and the further opening 52 to each comprise an inlet 54, in particular, to comprise inlets 54 which are spatially or fluidically separate from each other.

Preferably the inlet 54 and the outlet 56 are arranged or oriented oppositely in a longitudinal direction of the flow space 16 with respect to the respective perturbing contour 30.

For example, an inlet cross section area of the inlet 54 is larger than an outlet cross section area of the outlet 56. In the exemplary embodiment shown in FIG. 2, the inlet cross section area is for example 4.0 mm^2. The outlet cross section area is for example 2.0 mm^2. Of course, other values are possible. The value of the outlet cross section area and the value of the inlet cross section area, especially a ratio of the inlet cross section area and the outlet cross section area, will depend on the technical requirements of the cooling plate 10, especially the requirements for temperature control performance, especially the cooling performance, and/or the requirements on a flow resistance of the cooling plate 10 for the coolant.

FIG. 2 shows an exemplary flow profile of the coolant on a perturbing contour 30. Two partial flows 32c and 32d flow around the perturbing contour 30. One partial flow 32e flows underneath the perturbing contour 30. The partial flow at first flows into the inlet 54 and then flows out from the outlet 56.

The perturbing contours 30 have for example a round support surface 36. For example, the perturbing contours 30 and/or the support surface 36 have a diameter 37 of 3 mm. In alternative embodiments, the value of the diameter 37 depends on the technical requirements, especially the requirements for temperature control performance, especially cooling performance, and/or the requirements on a flow resistance of the cooling plate 10 for the coolant.

Figure 3:
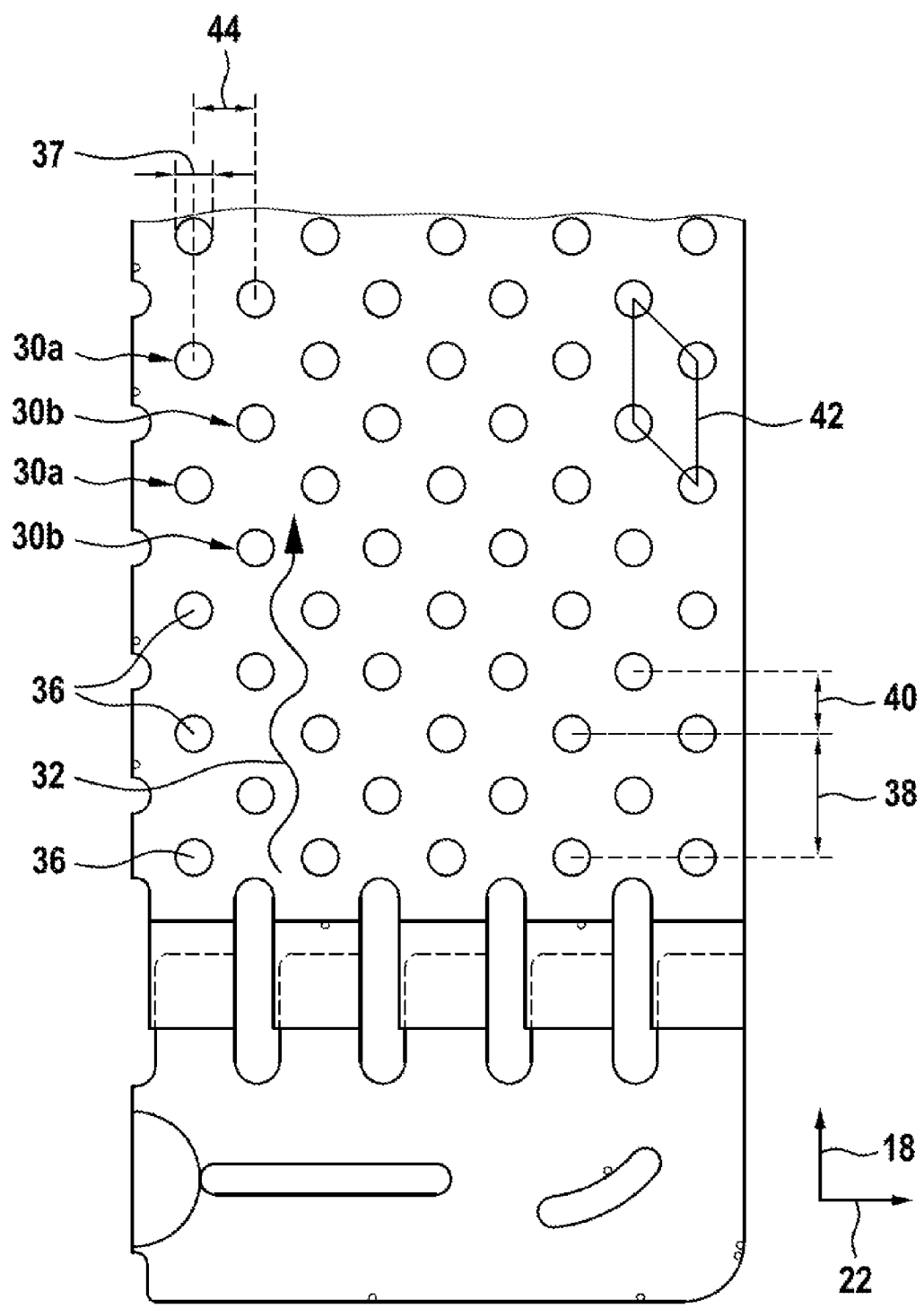
FIG. 3 shows a schematic representation of the first embodiment of the cooling plate according to the present invention in a top view and FIG. 4 shows a second embodiment of a cooling plate according to the present invention with a first cover.

FIG. 3 shows a top view of a cooling plate 10 according to FIG. 2 in a schematic view to illustrate an arrangement of the perturbing contours 30. For sake of clarity, the opening 50, the further opening 52, the inlets 54 and the outlets 56 are not shown in FIG. 3.

FIG. 3 shows a view of the cooling plate 10 along a normal to the cooling plate 34.

As an example, a plurality of first perturbing contours 30a are arranged in a first row along the longitudinal direction 18. A plurality of second perturbing contours 30b are arranged in a second row along the longitudinal direction 18, as an example.

The first perturbing contours 30a within the first row are arranged for example equidistant. The first perturbing contours 30a within the first row have in each case the same contour spacing 38 from their nearest first perturbing contours 30a in the first row. In the exemplary embodiment, the contour spacing 38 is 1.0 cm, for example. In alternative embodiments, the value of the contour spacing 38 will depend on the technical requirements, especially a dimensioning of the battery cell and/or a dimensioning—such as a length—of the flow space 16. Preferably the value of the contour spacing 38 will depend on the requirements for temperature control performance, especially the cooling performance, and/or the requirements on a flow resistance of the cooling plate 10 for the coolant. In the exemplary embodiment shown in FIG. 3, the second perturbing contours 30b within the second row are arranged equidistant, for example. The second perturbing contours 30b in the second row have in each case the contour spacing 38 from their nearest second perturbing contours 30b in the second row.

In the exemplary embodiment, the second perturbing contours 30b of the second row are offset by an offset length 40 from the first perturbing contours 30a of the first row. The offset length 40 is in particular a distance along the longitudinal direction 18 between a first perturbing contour 30a and the closest second perturbing contour 30b or a projection of a distance between a first perturbing contour 30a and the closest second perturbing contour 30b onto the longitudinal direction 18. In the exemplary embodiment, the offset length 40 is 0.5 cm, for example, or 50% of the contour spacing 38. In advantageous variants, the offset length 40 is between 10% and 40% of the contour spacing 38, especially advantageously between 20% and 30%.

In the exemplary embodiment, each time four perturbing contours 30 of a plurality of perturbing contours 30 form a parallelogram 42.

For example, the first row of first perturbing contours 30a and the second row of second perturbing contours 30b are arranged parallel to each other. In advantageous variants, the first row of first perturbing contours 30a and/or the second row of second perturbing contours 30b are arranged parallel or largely parallel to the longitudinal direction 18. In the exemplary embodiment shown in FIG. 3, the first row of first perturbing contours 30a and the second row of second perturbing contours 30b have a row spacing 44 from each other. For example, the row spacing 44 is 0.5 cm. Advantageously, the row spacing 44 is oriented parallel or largely parallel to the width direction 22. In alternative embodiments, the value of the row spacing 44 depends on the technical requirements, especially on a dimensioning of the battery cell and/or on a dimensioning—such as a length—of the flow space 16. Preferably, the value of the row spacing 44 depends on the requirements for temperature control performance, especially cooling performance, and/or the requirements on the flow resistance of the cooling plate 10 for the coolant. In variants, the row spacing 44 is between 3% and 30% of the flow space width 24, preferably between 5% and 20%, especially preferably between 10% and 15%.

In the exemplary embodiment, the flow space 16 is bounded for example by two webs 46. The webs 46 are arranged for example each parallel to the longitudinal direction 18.

Figure 4:
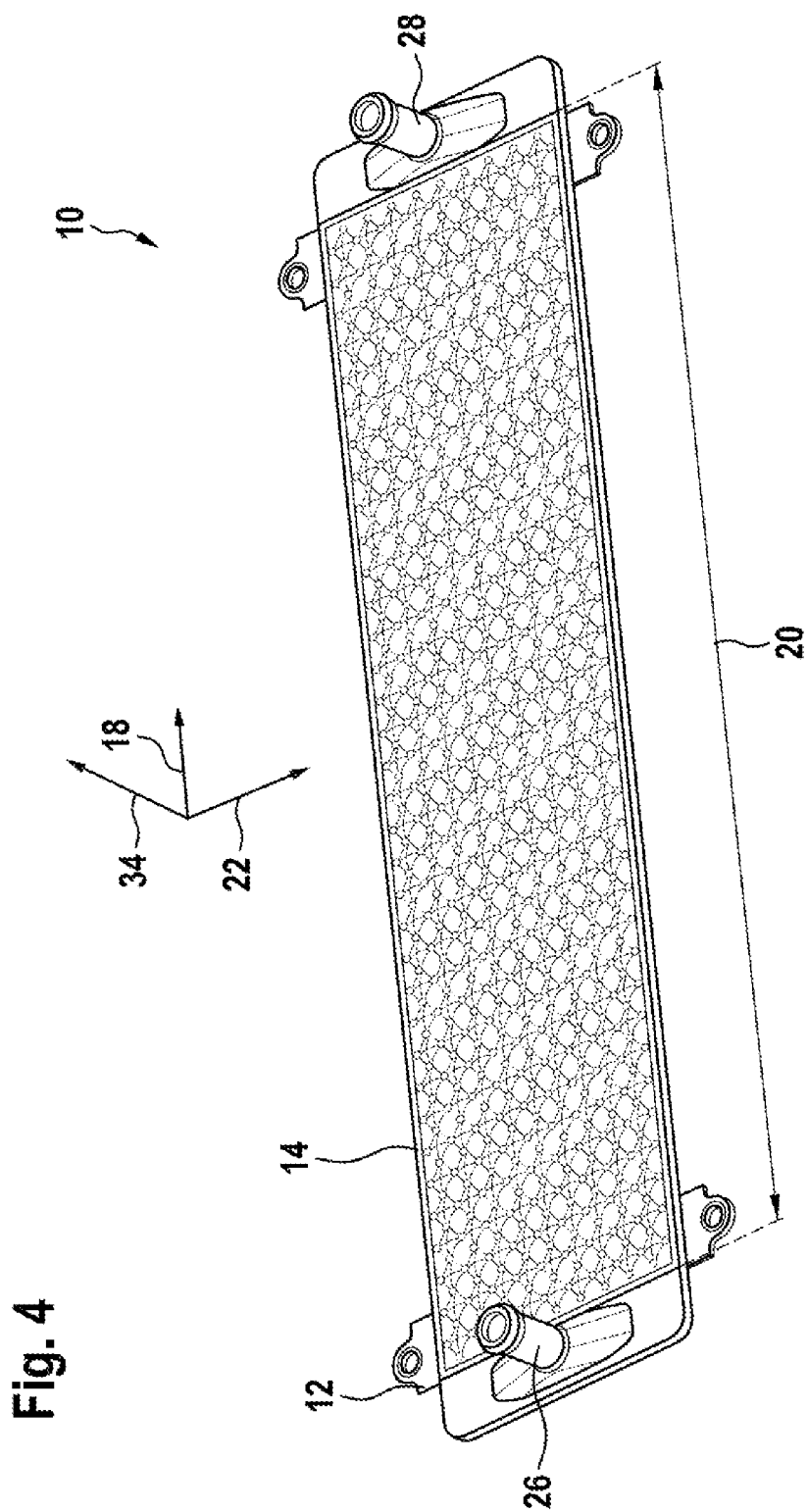

FIG. 4 shows an exemplary embodiment in which the cooling plate 10 comprises a first cover 14. The flow space 16 is covered or closed off by the first cover 14. In particular, the flow space 16 is closed off by the first cover 14 from the outer surroundings. The first cover 14 bounds the flow space 16 in fluid-tight fashion, for example. For example, the first cover 14 contacts the perturbing contours 30 mechanically. Preferably, the first cover 14 contacts the support surfaces 36. Preferably, the first cover 14 is provided for thermal contacting with the at least one battery cell. Preferably, the first cover 14 is arranged perpendicular or largely perpendicular to the normal to the cooling surface 34.

In the exemplary embodiment, the cooling plate 10 comprises for example a second cover, which in particular bounds the flow space in fluid-tight fashion at the further opening 52. Preferably, the second cover is arranged perpendicular or largely perpendicular to the normal to the cooling surface 34. In the exemplary embodiment, for example, the first cover 14 and the second cover are oriented oppositely in a direction of the normal to the cooling surface 34.

Preferably, the first cover 14 is arranged above the frame 12 or the first cover 14 is arranged in the direction of the normal to the cooling surface 34, starting from the frame 12, or the first cover 14 is arranged on a top side of the frame 12, on which the perturbing contours 30 are arranged. Preferably, the second cover is arranged beneath the frame 12 or the second cover is arranged opposite the direction of the normal to the cooling surface 34, starting from the frame 12, or the second cover is arranged on an underside of the frame 12, which is arranged opposite the top side of the frame 12 and oriented parallel or largely parallel to the top side of the frame 12.

In the exemplary embodiment shown in FIG. 4, the first cover 14 is flexible in configuration. In the exemplary embodiment shown in FIG. 4, the flexibly configured first cover 14 can be stretched or inflated outwardly or in the direction of the normal to the cooling plate 34 by an internal pressure of the coolant flowing through the flow space 16. This has the advantage of equalizing unevenness in a surface of the battery cell designed for the contacting of the cooling plate 10. This improves the thermal contacting.

The flexibly configured cover 14 is formed in the exemplary embodiment for example as a composite film. The flexibly configured cover 14 is for example materially bonded to the webs 46. In the exemplary embodiment, the materially bonded connection between the flexibly configured cover 14 with the frame 12 or the webs 46 is produced for example by a sealing process or a sealing method.

In the exemplary embodiment shown in FIG. 4, the flexibly configured cover 14 is connected for example to the perturbing contours 30. For example, the materially bonded connection between the flexibly configured cover 14 with the perturbing contours 30 is produced by a sealing process or a sealing method.

The invention claimed is:

1. A cooling plate (10) for temperature control of at least one battery cell, the cooling plate having a frame (12) with a flow space (16) configured to have a coolant flow therethrough, and at least one perturbing contour (30) arranged inside the flow space (16), the perturbing contour being configured to increase turbulence in the coolant flowing through the flow space and being configured to support the at least one battery cell or to mechanically contact a first cover (14) of the flow space (16), wherein the at least one perturbing contour (30) is arranged in the flow space (16) such that the coolant flowing through the flow space (16) can flow around the perturbing contour (30) and furthermore wherein the at least one perturbing contour (30) is formed in a manner of at least one opening (50) in such a way that the coolant flowing through the flow space (16) can flow through the at least one perturbing contour (30) and/or wherein the frame (12) forms at least one further opening (52) situated beneath the at least one perturbing contour (30) in such a way that the coolant flowing through the flow space (16) can flow beneath the at least one perturbing contour (30), wherein the opening (50) and/or the further opening (52) each comprise an inlet (54) configured for an inflow of the coolant and an outlet (56) configured for an outflow of the coolant, wherein the inlet (54) and the outlet (56) are oriented oppositely in a longitudinal direction (18) of the flow space (16).

2. The cooling plate (10) according to claim 1, characterized in that the inlet (54) has an inlet cross section area and the outlet (56) has an outlet cross section area, wherein the inlet cross section area is larger than the outlet cross section area.

3. The cooling plate (10) according to claim 1, characterized in that the at least one perturbing contour (30) has a round and/or oval and/or teardrop and/or parallelogram shaped cross section area and/or support surface (36) of the perturbing contour (30), which are each situated parallel to a longitudinal direction (18) of the flow space (16).

4. The cooling plate (10) according to claim 1, characterized in that a plurality of first perturbing contours (30a) are arranged in a first row along a longitudinal direction (18) of the flow space (16) and a plurality of second perturbing contours (30b) are arranged in a second row along the longitudinal direction (18) of the flow space (16).

5. The cooling plate (10) according to claim 4, characterized in that the second perturbing contours (30b) of the second row are offset from the first perturbing contours (30a) of the first row.

6. The cooling plate (10) according to claim 1, characterized in that each set of four perturbing contours (30) of a plurality of perturbing contours (30) form a parallelogram (42).

7. The cooling plate (10) according to claim 1, characterized by a first cover (14) mechanically contacting the at least one perturbing contour (30), which first cover bounds the flow space (16) in at least partly fluid-tight fashion and is configured for thermal contacting with the at least one battery cell.

8. The cooling plate (10) according to claim 7, characterized by a second cover which bounds the flow space (16) in at least partly fluid-tight fashion at the further opening (52).

9. The cooling plate (10) according to claim 7, characterized in that the first cover (14) is at least partially flexible in configuration.

10. The cooling plate (10) according to claim 7, characterized in that the first cover (14) comprises at least one film.

11. The cooling plate (10) according to claim 7, characterized in that the first cover (14) is materially bonded to the frame (12).

12. The cooling plate (10) according to claim 7, characterized in that the first cover (14) is materially bonded to webs (46) bordering on the flow space (16).

13. The cooling plate (10) according to claim 7, characterized in that the first cover (14) is materially bonded to the at least one perturbing contour (30).

14. A battery system comprising a cooling plate (10) according to claim 1 and a battery module, wherein the battery module comprises at least one battery cell arranged on the flow space (16) so that a thermal contacting of the at least one battery cell and the flow space (16) is formed.

15. A battery system comprising a cooling plate (10) according to claim 7 and a battery module, wherein the battery module comprises at least one battery cell arranged on the first cover (14) so that a thermal contacting of the at least one battery cell and the first cover (14) is formed.

16. A cooling plate (10) for temperature control of at least one battery cell, the cooling plate having a frame (12) with a flow space (16) configured to have a coolant flow therethrough, and at least one perturbing contour (30) arranged inside the flow space (16), the perturbing contour being configured to increase turbulence in the coolant flowing through the flow space and being configured to support the at least one battery cell or to mechanically contact a first cover (14) of the flow space (16), wherein the at least one perturbing contour (30) is arranged in the flow space (16) such that the coolant flowing through the flow space (16) can flow around the perturbing contour (30) and furthermore wherein the at least one perturbing contour (30) is formed in a manner of at least one opening (50) in such a way that the coolant flowing through the flow space (16) can flow through the at least one perturbing contour (30), wherein the opening (50) comprises an inlet (54) configured for an inflow of the coolant and an outlet (56) configured for an outflow of the coolant, wherein the inlet (54) and outlet (56) are oriented oppositely in a longitudinal direction (18) of the flow space (16).

17. The cooling plate (10) according to claim 16, characterized in that the inlet (54) has an inlet cross section area and the outlet (56) has an outlet cross section area, wherein the inlet cross section area is larger than the outlet cross section area.

18. A cooling plate (10) for temperature control of at least one battery cell, the cooling plate having a frame (12) with a flow space (16) configured to have a coolant flow therethrough, and at least one perturbing contour (30) arranged inside the flow space (16), the perturbing contour being configured to increase turbulence in the coolant flowing through the flow space and being configured to support the at least one battery cell or to mechanically contact a first cover (14) of the flow space (16), wherein the at least one perturbing contour (30) is arranged in the flow space (16) such that the coolant flowing through the flow space (16) can flow around the perturbing contour (30) and furthermore wherein the frame (12) forms at least one opening (52) situated beneath the at least one perturbing contour (30) in such a way that the coolant flowing through the flow space (16) can flow beneath the at least one perturbing contour (30), wherein the opening (52) comprises an inlet (54) configured for an inflow of the coolant and an outlet (56) configured for an outflow of the coolant, wherein the inlet (54) and outlet (56) are oriented oppositely in a longitudinal direction (18) of the flow space (16).

19. The cooling plate (10) according to claim 18, characterized in that the inlet (54) has an inlet cross section area and the outlet (56) has an outlet cross section area, wherein the inlet cross section area is larger than the outlet cross section area.

\* \* \* \* \*